United States Patent
Ueda et al.

(10) Patent No.: US 9,473,723 B2
(45) Date of Patent: Oct. 18, 2016

(54) SOLID-STATE IMAGE SENSING DEVICE THAT PERFORMS AN A/D CONVERSION OPERATION AT HIGH SPEED

(71) Applicant: Renesas Electronics Corporation, Kawasaki-shi, Kanagawa (JP)

(72) Inventors: Kazuhiro Ueda, Kanagawa (JP); Shunsuke Okura, Kanagawa (JP); Fukashi Morishita, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/518,073

(22) Filed: Oct. 20, 2014

(65) Prior Publication Data

US 2015/0124138 A1    May 7, 2015

(30) Foreign Application Priority Data

Nov. 7, 2013   (JP) ................................ 2013-231019

(51) Int. Cl.
| | |
|---|---|
| H04N 5/378 | (2011.01) |
| H03M 1/00 | (2006.01) |
| H04N 5/376 | (2011.01) |
| H03M 1/66 | (2006.01) |
| H04N 5/3745 | (2011.01) |
| H04N 5/357 | (2011.01) |

(52) U.S. Cl.
CPC ............... *H04N 5/378* (2013.01); *H03M 1/00* (2013.01); *H03M 1/66* (2013.01); *H04N 5/3575* (2013.01); *H04N 5/376* (2013.01); *H04N 5/37455* (2013.01)

(58) Field of Classification Search
CPC .... H04N 5/3745; H04N 5/376; H04N 5/374; H03M 1/66; H03M 1/00
See application file for complete search history.

(56) References Cited

U.S. PATENT DOCUMENTS

| | | | | |
|---|---|---|---|---|
| 6,128,039 A | * | 10/2000 | Chen .................... | G11C 19/285 250/208.1 |
| 7,565,033 B2 | | 7/2009 | Hanson et al. | |
| 7,609,303 B1 | * | 10/2009 | Lee ....................... | H04N 5/3575 348/241 |
| 7,719,586 B2 | * | 5/2010 | Koseki ................... | H04N 5/378 348/300 |
| 7,755,018 B2 | * | 7/2010 | Barna ...................... | H03F 3/08 250/208.1 |
| 2009/0073274 A1 | * | 3/2009 | Dai ........................ | H04N 5/235 348/222.1 |
| 2010/0231796 A1 | * | 9/2010 | Mandelli ................ | H04N 5/357 348/607 |
| 2011/0261233 A1 | * | 10/2011 | Zhang .................... | H04N 5/335 348/241 |
| 2013/0068930 A1 | * | 3/2013 | Nakamura .......... | H04N 5/37455 250/208.1 |
| 2014/0027611 A1 | * | 1/2014 | Patel ...................... | H04N 5/361 250/208.1 |
| 2014/0184865 A1 | * | 7/2014 | Muto .................... | H03M 1/183 348/300 |

FOREIGN PATENT DOCUMENTS

| | | |
|---|---|---|
| JP | 2003-143490 A | 5/2003 |
| JP | 2007-243930 A | 9/2007 |

\* cited by examiner

*Primary Examiner* — Abdelaaziz Tissire
(74) *Attorney, Agent, or Firm* — Sughrue Mion, PLLC

(57) ABSTRACT

Provided is a solid-state image sensing device that performs an A/D conversion operation at high speed. A sample-and-hold section 12 included in an A/D converter in a CMOS image sensor includes switches S1a and S1b and capacitor C1 that sample and hold a dark signal during each cycle period, switches S2a and S2b and capacitor C2 that sample and hold a bright signal during an odd-numbered cycle period, and switches S3a and S3b and capacitor C3 that sample and hold a bright signal during an even-numbered cycle period. While a bright signal is held with switch S2b placed in a conducting state, the next bright signal can be sampled by placing switch S3a in a conducting state.

4 Claims, 9 Drawing Sheets

SOLID-STATE IMAGE SENSING DEVICE THAT PERFORMS AN A/D CONVERSION OPERATION AT HIGH SPEED

CROSS-REFERENCE TO RELATED APPLICATIONS

The disclosure of Japanese Patent Application No. 2013-231019 filed on Nov. 7, 2013 including the specification, drawings, and abstract is incorporated herein by reference in its entirety.

BACKGROUND

The present invention relates to a solid-state image sensing device and is preferably applicable, for example, to a complementary metal-oxide semiconductor (CMOS) image sensor.

A related-art solid-state image sensing device disclosed, for example, in Japanese Unexamined Patent Application Publication No. 2003-143490 includes two signal processing circuits. This solid-state image sensing device acquires an input voltage by resetting a capacitor in one signal processing circuit, and amplifies and outputs the voltage of a capacitor in the other signal processing circuit.

Another related-art solid-state image sensing device disclosed, for example, in Japanese Unexamined Patent Application Publication No. 2007-243930 includes two digitization circuits. This solid-state image sensing device causes one digitization circuit to perform a sample-and-hold operation and causes the other digitization circuit to perform analog-to-digital conversion (A/D conversion).

SUMMARY

However, related-art solid-state image sensing devices are slow in A/D conversion operation. Other problems and novel features will become apparent from the following description and from the accompanying drawings.

According to an aspect of the present invention, a first sample-and-hold circuit samples and holds a dark signal, and second to Mth sample-and-hold circuits sequentially sample and hold a bright signal.

The above aspect of the present invention makes it possible to perform an A/D conversion operation at high speed.

DETAILED DESCRIPTION

First Embodiment

Figure 1:
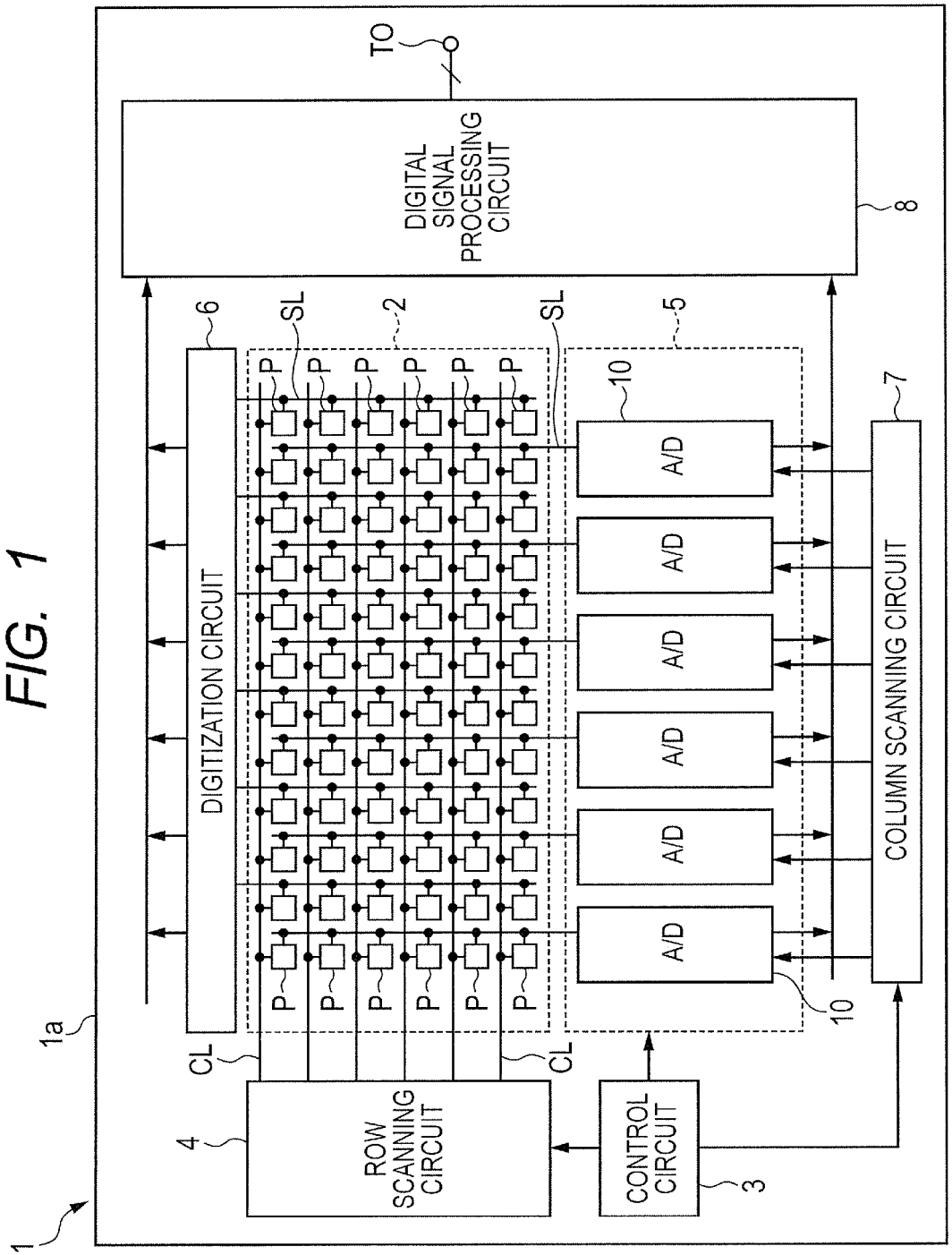
FIG. 1 is a block diagram illustrating the configuration of a CMOS image sensor according to a first embodiment of the present invention.

FIG. 1 is a block diagram illustrating the configuration of a CMOS image sensor (solid-state image sensing device) 1 according to a first embodiment of the present invention. Referring to FIG. 1, the CMOS image sensor 1 includes a pixel array 2, a control circuit 3, a row scanning circuit 4, digitization circuits 5, 6, a column scanning circuit 7, a digital signal processing circuit 8, and output terminals TO. These components are formed over the surface of a semiconductor substrate 1a.

The pixel array 2 includes a plurality of pixel circuits P arrayed in a plurality of rows and columns, a plurality of control signal lines CL provided respectively for the rows, and a plurality of signal lines SL provided respectively for the columns. The pixel circuits P are controlled by the control signals given from the row scanning circuit 4 through the associated control signal lines CL and output a dark signal (reset signal) and a bright signal (luminance signal) to the associated signal lines SL. The dark signal has a reference voltage. The bright signal has a voltage corresponding to incident light intensity.

When a color image is to be picked up, the pixel circuits P are each formed to be sensitive to red, green, or blue, and are disposed in a Bayer pattern. In the Bayer pattern, a row in which green pixel circuits P and red pixel circuits P are alternately disposed and a row in which green pixel circuits P and blue pixel circuits P are alternately disposed are alternately arrayed.

The control circuit 3 controls the entire CMOS image sensor 1 in accordance with an external control signal. The row scanning circuit 4 is coupled to one ends of the control signal lines CL, sequentially selects the rows one by one, gives the control signals to each pixel circuit P in the selected row, and allows each pixel circuit P to output a dark signal and a bright signal. The row scanning circuit 4 operates in synchronism with a clock signal and selects each row for a period of one cycle. Each pixel circuit P outputs the dark signal and the bright signal during a period of one cycle.

The digitization circuit 5 is disposed on one side (the lower side in FIG. 1) of the pixel array 2 and includes a plurality of A/D converters 10, which are provided for odd-numbered rows. Each A/D converter 10 converts each of the dark and bright signals, which are given from the pixel circuits P in the associated rows selected by the row scanning circuit 4 through the associated signal lines SL, to a digital signal.

The digitization circuit 6 is disposed on the other side (the upper side in FIG. 1) of the pixel array 2 and includes a plurality of A/D converters 10, which are provided for even-numbered rows. Each A/D converter 10 converts each of the dark and bright signals, which are given from the pixel circuits P in the associated rows selected by the row scanning circuit 4 through the associated signal lines SL, to a digital signal.

The column scanning circuit 7 sequentially selects the columns one by one in response to the completion of A/D conversion of the dark and bright signals that are output from the pixel circuits P belonging to a row selected by the row scanning circuit 4. The A/D converter 10 in a selected column sends the digital signal indicative of the dark signal and the digital signal indicative of the bright signal to the digital signal processing circuit 8 through a data bus.

The digital signal processing circuit 8 temporarily stores a screenful of digital signal indicative of the dark signal and a screenful of digital signal indicative of the bright signal, performs a predetermined process to generate a screenful of image signal, and outputs the generated image signal to the outside through the output terminals TO.

Figure 2:
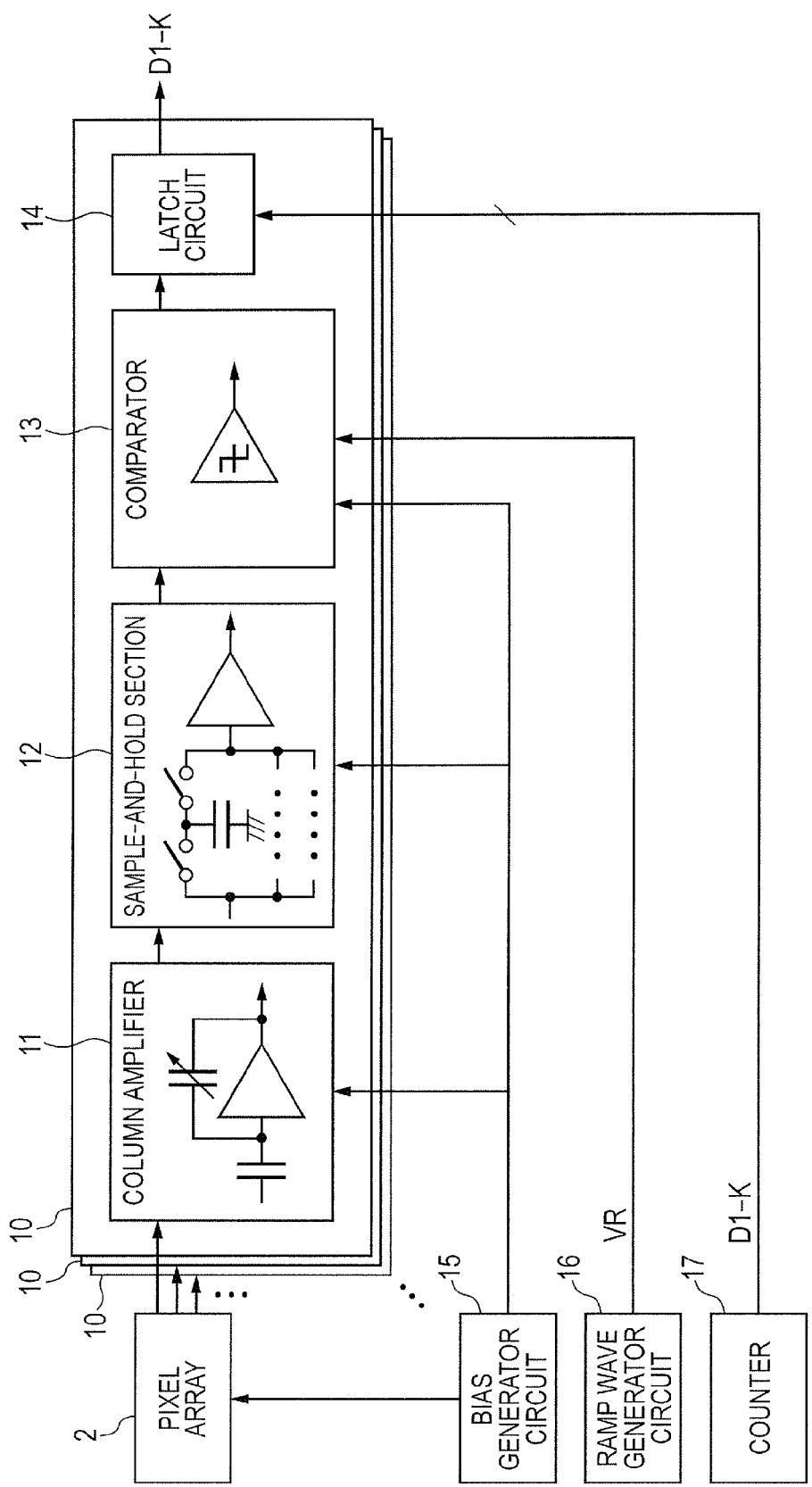
FIG. 2 is a circuit block diagram illustrating the configuration of an A/D converter shown in FIG. 1.

FIG. 2 is a circuit block diagram illustrating the configuration of the A/D converters 10. Referring to FIG. 2, the A/D converters 10 each include a column amplifier 11, a sample-and-hold section 12, a comparator 13, and a latch circuit 14. Further, a bias generator circuit 15, a ramp wave generator circuit 16, and a counter 17 are commonly provided for all the A/D converters.

The bias generator circuit 15 generates a predetermined bias voltage and gives the generated bias voltage to the column amplifier 11, to the sample-and-hold section 12, and to the comparator 13. The ramp wave generator circuit 16 generates a ramp wave signal VR whose voltage decreases at a fixed gradient, and gives the ramp wave signal VR to the comparator 13. The counter 17 generates K bits of count signals D1 to DK (K is an integer of 2 or greater) and gives the generated count signals D1 to DK to the latch circuit 14. A count value indicated by the count signals D1 to DK increases in proportion to the time during which the voltage of the ramp wave signal RV decreases.

The column amplifier 11 receives the dark and bright signals supplied from the pixel circuits P in the associated column selected by the row scanning circuit 4 through the signal lines SL and amplifies each of the dark and bright signals by a preselected gain. The gain of the column amplifier 11 can be changed.

The sample-and-hold section 12 samples and holds the output signal of the column amplifier 11. The sample-and-hold section 12 includes first to third sample-and-hold circuits. The first sample-and-hold circuit samples and holds the dark signal amplified by the column amplifier 11 for a period of each cycle.

The second sample-and-hold circuit samples the bright signal amplified by the column amplifier 11 for a period of each odd-numbered cycle, and holds the sampled bright signal. The third sample-and-hold circuit samples the bright signal amplified by the column amplifier 11 for a period of each even-numbered cycle, and holds the sampled bright signal.

In other words, the second and third sample-and-hold circuits sample and hold the bright signal amplified by the column amplifier 11 during a cycle period alternately selected at one-cycle intervals.

The comparator 13 compares the voltage of the output signal of the sample-and-hold section 12 and the voltage of the ramp wave signal VR during each cycle period and outputs a signal indicative of the result of comparison. If the voltage of the ramp wave signal VR drops below the voltage of the output signal of the sample-and-hold section 12, the output signal of the comparator 13 falls from H level to L level. The comparison between the voltage of the output signal of the sample-and-hold section 12 and the voltage of the ramp wave signal VR is made for each of the dark and bright signals.

When the output signal of the comparator 13 falls from H level to L level, the latch circuit 14 latches the count signals D1 to DK generated by the counter 17, and outputs the latched count signals D1 to DK as the result of A/D conversion. Hence, digital signals D1 to DK indicative of the voltage of the dark signal and digital signals D1 to DK indicative of the voltage of the bright signal are generated during each cycle period. The difference between the voltage of the dark signal and the voltage of the bright signal varies with the intensity of light incident on each pixel circuit P.

Figure 3:
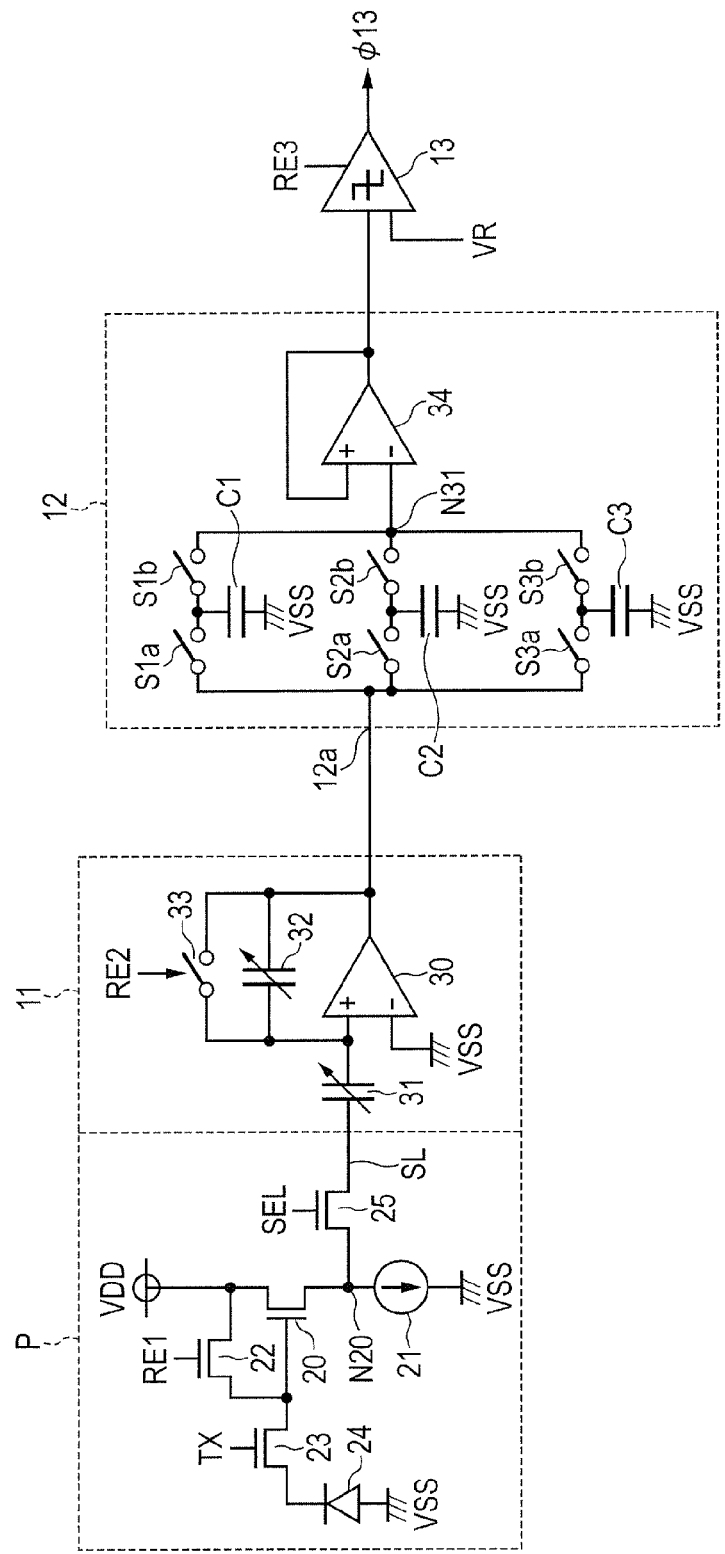
FIG. 3 is a circuit diagram illustrating a pixel circuit shown in FIG. 1 and essential parts of the A/D converter shown in FIG. 2.

FIG. 3 is a circuit diagram illustrating a pixel circuit P and essential parts of an A/D converter 10. Referring to FIG. 3, the pixel circuits P each include N-channel MOS transistors 20, 22, 23, 25, a constant current source 21, and a photodiode 24. The transistor 20 and the constant current source 21 are series-coupled between a line of power supply voltage VDD and a line of ground voltage VSS. The transistor 22 is coupled between the drain and gate of the transistor 20. The gate of the transistor 22 receives a reset signal RE1.

The drain of the transistor 23 is coupled to the gate of the transistor 20. The gate of the transistor 23 receives a read signal TX. The anode of the photodiode 24 is coupled to the ground voltage VSS line. The cathode of the photodiode 24 is coupled to the source of the transistor 23. The drain of the transistor 25 is coupled to the source (node N20) of the transistor 20. The source of the transistor 25 is coupled to the column amplifier 11 through the associated signal line SL. The gate of the transistor 25 receives a row selection signal SEL.

The signals SEL, RE1, TX are generated by the row scanning circuit 4. When the selection signal SEL is at H level, which is a selection level, the transistor 25 goes into a conducting state to couple the node N20 of the pixel circuit P to the signal line SL. When the reset signal RE1 is at H level, which is an activation level, the transistor 22 goes into a conducting state to reset the gate of the transistor 20 to the power supply voltage VDD so that the dark signal is output to the node N20. When the read signal TX is at H level, which is an activation level, the transistor 23 goes into a conducting state so that a current at a level corresponding to the intensity of light incident on the photodiode 24 flows out of the gate of the transistor 20. The gate voltage of the transistor 20 then decreases to decrease the current flowing to the transistor 20, thereby decreasing the voltage of the node N20. In this instance, the signal appearing at the node N20 is a bright signal.

The column amplifier 11 includes an operational amplifier 30, variable capacitors 31, 32, and a switch 33. The variable capacitor 31 is coupled between the associated signal line SL and the non-inverting input terminal (+terminal) of the operational amplifier 30. The variable capacitor 32 is coupled between the non-inverting input terminal and output terminal of the operational amplifier 32. The switch 33 is parallel-coupled to the variable capacitor 32 and placed in a conducting state when a reset signal RE2 is at H level, which is an activation level. The inverting input terminal (−terminal) of the operational amplifier 30 receives the ground voltage VSS.

When the reset signal RE2 is at H level, which is an activation level, the switch 33 goes into a conducting state to reset the non-inverting input terminal and output terminal of the operational amplifier 30 to a common mode voltage, which is substantially equal to the ground voltage VSS. When the switch 33 goes into a non-conducting state, the column amplifier 11 is activated. The gain of the column amplifier 11 is determined by the capacitance ratio between the variable capacitor 32 and the variable capacitor 31 and can be changed. The column amplifier 11 amplifies each of the dark and bright signals from the pixel circuit P by a preselected gain.

The sample-and-hold section 12 includes switches S1a to S3a, S1b to S3b, capacitors C1 to C3, and an operational amplifier 34. The input terminal 12a of the sample-and-hold section 12 receives an output signal of the column amplifier 11. The switches S1a, S1b are series-coupled between the input terminal 12a and the inverting input terminal (−terminal) of the operational amplifier 34. The capacitor C1 is coupled between the ground voltage VSS line and a node between the switches S1a, S1b. The switches S1a, S1b and the capacitor C1 form a first sample-and-hold circuit.

When a dark signal is to be sampled during each cycle period, the switch S1a goes into a conducting state with the switch S1b placed in a non-conducting state so that the capacitor C1 is charged with a voltage at the input terminal 12a. When the dark signal is to be held during each cycle period, the switch S1a goes into a non-conducting state with the switch S1b placed in a conducting state so that the inter-terminal voltage of the capacitor C1 is output to a node N31.

The switches S2a, S2b are series-coupled between the input terminal 12a and the node N31. The capacitor C2 is coupled between the ground voltage VSS line and a node between the switches S2a, S2b. The switches S2a, S2b and the capacitor C2 form a second sample-and-hold circuit.

When a bright signal is to be sampled during an odd-numbered cycle period, the switch S2a goes into a conducting state with the switch S2b placed in a non-conducting state so that the capacitor C2 is charged with a voltage at the input terminal 12a. When the bright signal is to be held, the switch S2a goes into a non-conducting state with the switch S2b placed in a conducting state so that the inter-terminal voltage of the capacitor C2 is output to the node N31. The switches S2a, S2b do not simultaneously go into a conducting state.

The switches S3a, S2b are series-coupled between the input terminal 12a and the node N31. The capacitor C3 is coupled between the ground voltage VSS line and a node between the switches S3a, S3b. The switches S3a, S3b and the capacitor C3 form a third sample-and-hold circuit.

When a bright signal is to be sampled during an even-numbered cycle period, the switch S3a goes into a conducting state with the switch S3b placed in a non-conducting state so that the capacitor C3 is charged with a voltage at an input terminal 13a. When the bright signal is to be held, the switch S3a goes into a non-conducting state with the switch S3b placed in a conducting state so that the inter-terminal voltage of the capacitor C2 is output to the node N31. The switches S3a, S3b do not simultaneously go into a conducting state. Two of the switches S1a to S3a do not simultaneously go into a conducting state. Further, two of the switches S1b to S3b do not simultaneously go into a conducting state.

The output terminal and non-inverting input terminal (+terminal) of the operational amplifier 34 are intercoupled. The operational amplifier 34 outputs a voltage having the same level as a voltage of the node N31 as the output voltage of the sample-and-hold section 12.

The comparator 13 compares the output voltage of the sample-and-hold section 12 and the voltage of the ramp wave signal VR and outputs a signal $\phi 13$ indicative of the result of comparison. If the output voltage of the sample-and-hold section 12 is lower than the voltage of the ramp wave signal VR, the signal $\phi 13$ is at H level. If the output voltage of the sample-and-hold section 12 is higher than the voltage of the ramp wave signal VR, the signal $\phi 13$ is at L level.

Figure 4:
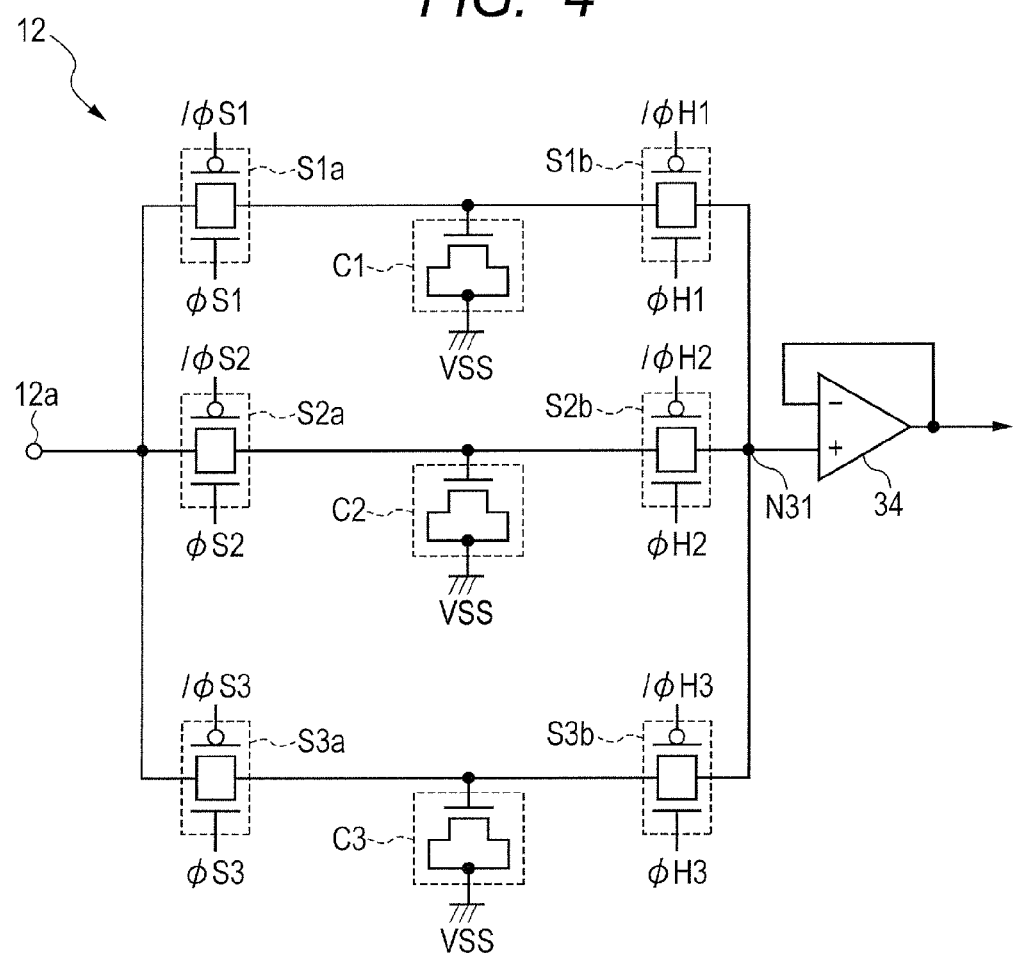
FIG. 4 is a circuit diagram illustrating the configuration of a sample-and-hold section shown in FIG. 3.
Figure 5:
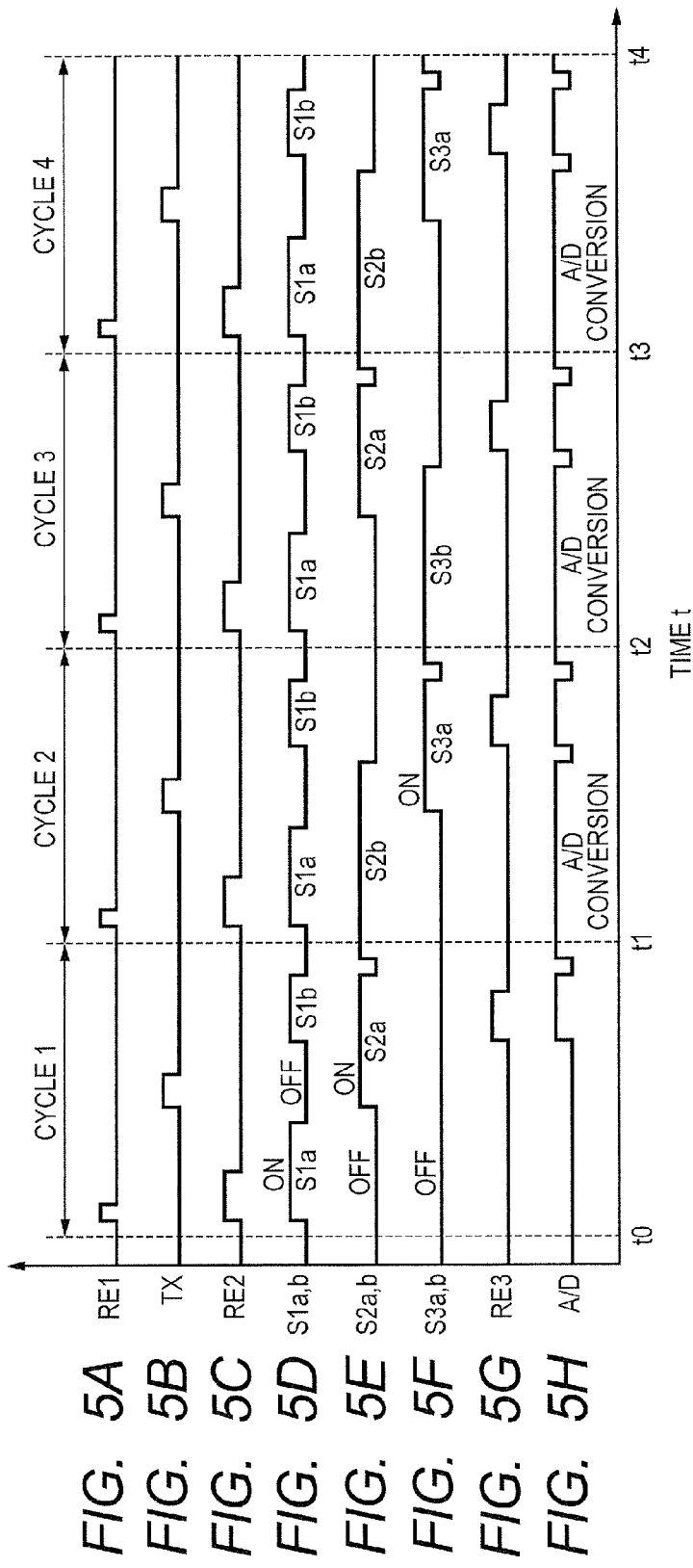
FIGS. 5A to 5H are timing diagrams illustrating the operations of the CMOS image sensor shown in FIGS. 1 to 4.

FIG. 4 is a circuit diagram illustrating the configuration of the sample-and-hold section 12. As shown in FIG. 4, the switches S1a to S3a, S1b to S3b are each formed by a transfer gate that includes a P-channel MOS transistor and an N-channel MOS transistor, which are parallel-coupled. The gates of the P-channel MOS transistors included in the switches S1a to S3a, S1b to S3b respectively receive control signals /$\phi$S1 to $\phi$S3, /$\phi$H1 to $\phi$H3. The gates of the N-channel MOS transistors included in the switches S1a to S3a, S1b to S3b respectively receive control signals $\phi$S1 to $\phi$S3, $\phi$H1 to $\phi$H3. The control signals /$\phi$S1 to /$\phi$S3, /$\phi$H1 to /$\phi$H3 are the inversions of the control signals $\phi$S1 to $\phi$S3, $\phi$H1 to $\phi$H3, respectively.

When the control signals $\phi$S1 to $\phi$S3, $\phi$H1 to $\phi$H3 are at H level, the switches S1a to S3a, S1b to S3b go into a conducting state. When the control signals $\phi$S1 to $\phi$S3, $\phi$H1 to $\phi$H3 are at L level, the switches S1a to S3a, S1b to S3b go into a non-conducting state.

The capacitors C1 to C3 each include an N-channel MOS transistor. The source and drain of the N-channel MOS transistor included in the capacitor C1 both receive the ground voltage VSS, and the gate is coupled to a node between the switches S1a, S1b. The source and drain of the N-channel MOS transistor included in the capacitor C2 both receive the ground voltage VSS, and the gate is coupled to a node between the switches S2a, S2b. The source and drain of the N-channel MOS transistor included in the capacitor C3 both receive the ground voltage VSS, and the gate is coupled to a node between the switches S3a, S3b.

FIGS. 5A to 5H are timing diagrams illustrating the operations of the CMOS image sensor 1. Referring to FIGS. 5A to 5H, the CMOS image sensor 1 selects a plurality of rows for a predetermined period of time (one cycle period) in synchronism with a clock signal. FIGS. 5A to 5H indicate that four rows are selected in cycles 1 to 4. Within each cycle period, the switches S1a, S1b remain in a conducting state for a predetermined period of time so that a dark signal output from a pixel circuit P is sampled, held, and subjected to A/D conversion.

Further, the switch S2a conducts during an odd-numbered cycle period to sample a bright signal of an odd-numbered pixel circuit P, and the switch S2b conducts during the same cycle period and the following even-numbered cycle period to hold the bright signal, which is then subjected to A/D conversion.

Furthermore, the switch S3a conducts during an even-numbered cycle period to sample a bright signal of an even-numbered pixel circuit P, and the switch S3b conducts during the same cycle period and the following odd-numbered cycle period to hold the bright signal, which is then subjected to A/D conversion.

More specifically, the row scanning circuit 4 selects a certain odd-numbered row in cycle 1 (between time t0 and time t1) to read a dark signal and a bright signal from each pixel circuit P in the selected row. In other words, in each pixel circuit P in the selected row, the selection signal SEL and the reset signals RE1, RE2, which are shown in FIG. 3, rise to H level to place the switch S1a in a conducting state. When the selection signal SEL is at H level, the transistor 25 conducts to couple the node N20 to the column amplifier 11 through the signal line SL.

When the reset signal RE1 rises to H level, the transistor 22 of the pixel circuit P shown in FIG. 3 conducts to reset the gate of the transistor 20 to the power supply voltage VDD, thereby outputting a dark signal to the node N20. When the reset signal RE2 rises to H level, the switch 33 of the column amplifier 11 conducts to reset the output voltage of the column amplifier 11 to the common mode voltage.

Next, the reset signal RE1 falls to L level to place the transistor 22 in a non-conducting state. The reset signal RE2 then falls to L level to place the switch 33 in a non-conducting state, thereby activating the column amplifier 11. Hence, the dark signal appearing at the node N20 is amplified by the column amplifier 11 and given to the capacitor C1 through the switch S1a. The capacitor C1 is charged with the voltage of the dark signal.

Subsequently, when the switch S1a goes into a non-conducting state, the read signal TX rises to H level with the switch S2a placed in a conducting state. When the read signal TX is at H level, the transistor 23 goes into a conducting state so that a current having a level corresponding to the incident light intensity flows to the photodiode 24. This decreases the gate voltage of the transistor 20, thereby decreasing the voltage of the node N20. In this instance, the signal appearing at the node N20 is a bright signal. The bright signal is amplified by the column amplifier 11 and given to the capacitor C2 through the switch S2a. The capacitor C2 is charged with the voltage of the bright signal.

Next, the switch S1b goes into a conducting state so that a reset signal RE3 rises to H level to put a dark signal A/D conversion process on standby. When the switch S1b goes into a conducting state, the inter-terminal voltage of the capacitor C1 is given to the node N31, buffered by the operational amplifier 34, and given to the comparator 13. When the reset signal RE3 falls to L level, the dark signal A/D conversion process starts. The dark signal A/D conversion process ends in a short time.

When the dark signal A/D conversion process ends, the switches S1b, S2a go into a non-conducting state. When the switches S1b, S2a are placed in a non-conducting state, the node N31 of the sample-and-hold section 12 goes into a floating state.

Next, the switch S2b goes into a conducting state so that the inter-terminal voltage of the capacitor C2 is given to the node N31, buffered by the operational amplifier 34, and given to the comparator 13. This starts a bright signal A/D conversion process. The bright signal A/D conversion process takes time according to the incident light intensity and is performed in cycles 1 and 2.

In cycle 2 (between time t1 and time t2), the row scanning circuit 4 selects the next even-numbered row to read the dark and bright signals from each pixel circuit P in the selected row. In other words, in each pixel circuit P in the selected row, the selection signal SEL and the reset signals RE1, RE2, which are shown in FIG. 3, rise to H level to place the switch S1a in a conducting state. When the selection signal SEL is at H level, the transistor 25 conducts to couple the node N20 to the column amplifier 11 through the signal line SL.

When the reset signal RE1 rises to H level, the transistor 22 of the pixel circuit P shown in FIG. 3 conducts to reset the gate of the transistor 20 to the power supply voltage VDD, thereby outputting a dark signal to the node N20. When the reset signal RE2 rises to H level, the switch 33 of the column amplifier 11 conducts to reset the output voltage of the column amplifier 11 to the common mode voltage.

Next, the reset signal RE1 falls to L level to place the transistor 22 in a non-conducting state. The reset signal RE2 then falls to L level to place the switch 33 in a non-conducting state, thereby activating the column amplifier 11. Hence, the dark signal appearing at the node N20 is amplified by the column amplifier 11 and given to the capacitor C1 through the switch S1a. The capacitor C1 is charged with the voltage of the dark signal.

Subsequently, when the switch S1a goes into a non-conducting state, the read signal TX rises to H level with the switch S2a placed in a conducting state. When the read signal TX is at H level, the transistor 23 goes into a conducting state so that a current having a level corresponding to the incident light intensity flows to the photodiode 24. This decreases the gate voltage of the transistor 20, thereby decreasing the voltage of the node N20. In this instance, the signal appearing at the node N20 is a bright signal. The bright signal is amplified by the column amplifier 11 and given to the capacitor C3 through the switch S3a. The capacitor C3 is charged with the voltage of the bright signal.

Next, the switch S2a goes into a non-conducting state to terminate the bright signal A/D conversion process on the previous row. The switch S1b then goes into a conducting state so that the reset signal RE3 rises to H level to put a dark signal A/D conversion process on standby. When the switch S1b goes into a conducting state, the inter-terminal voltage of the capacitor C1 is given to the node N31, buffered by the operational amplifier 34, and given to the comparator 13. When the reset signal RE3 falls to L level, the dark signal A/D conversion process starts. The dark signal A/D conversion process ends in a short time.

When the dark signal A/D conversion process ends, the switches S1b, S3a go into a non-conducting state. When the switches S1b, S3a are placed in a non-conducting state, the node N31 of the sample-and-hold section 12 goes into a floating state.

Next, the switch S3b goes into a conducting state so that the inter-terminal voltage of the capacitor C3 is given to the node N31, buffered by the operational amplifier 34, and given to the comparator 13. This starts a bright signal A/D conversion process. The bright signal A/D conversion process takes time according to the incident light intensity and is performed in cycles 2 and 3. The subsequent operations are the same as described earlier.

Figure 6:
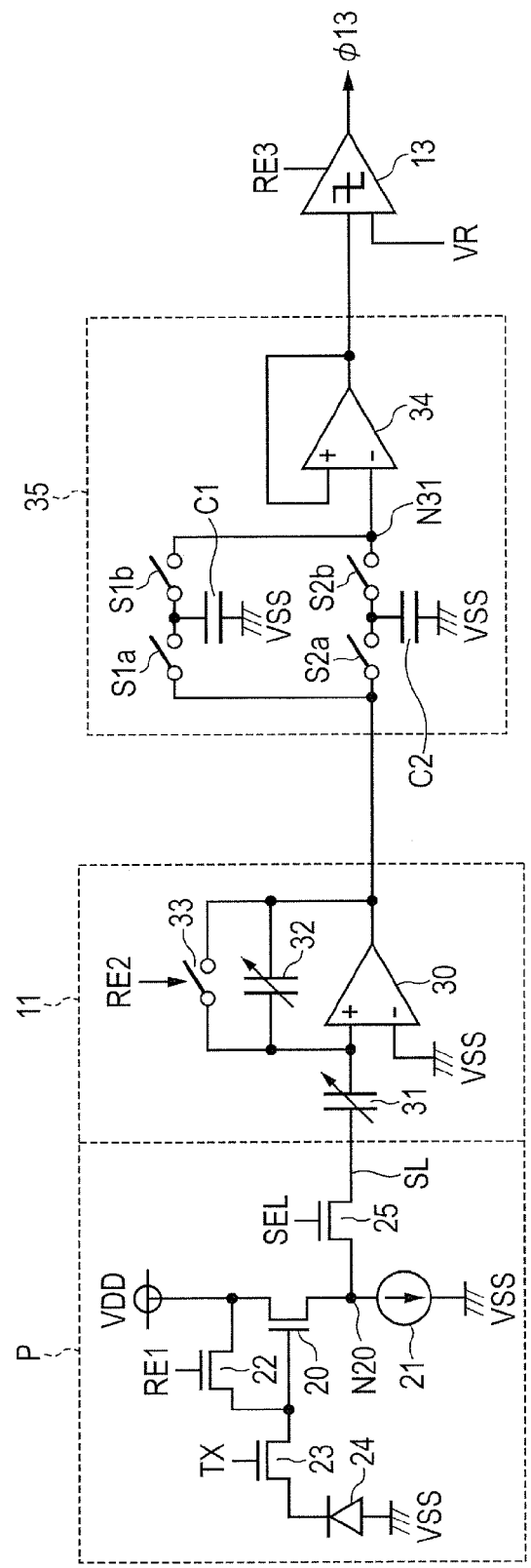
FIG. 6 is a circuit diagram illustrating essential parts of a comparison example of the first embodiment.
Figure 7:
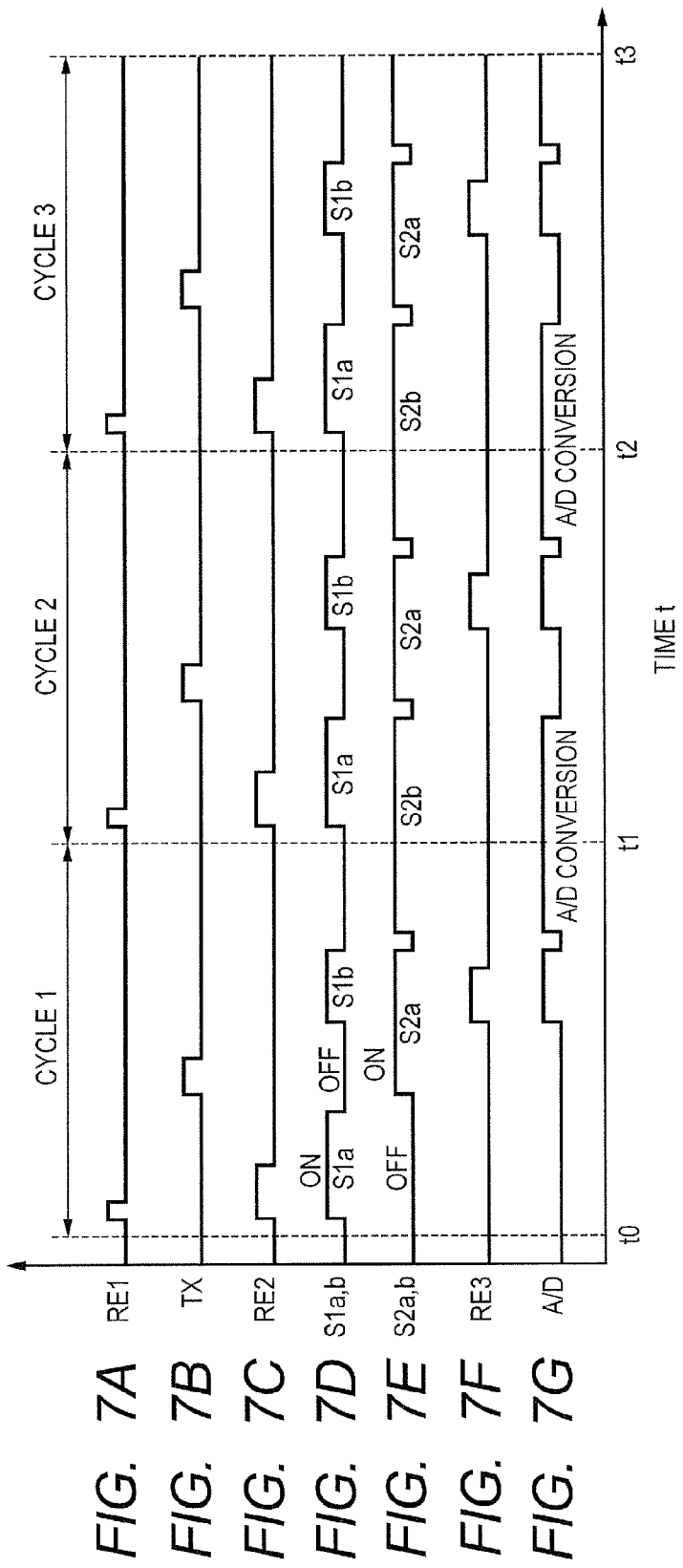
FIGS. 7A to 7G are timing diagrams illustrating the operations of a CMOS image sensor described with reference to FIG. 6.

FIG. 6 is a circuit diagram illustrating a comparison example of the first embodiment and is to be compared against FIG. 3. Referring to FIG. 6, the comparison example differs from the first embodiment in that the sample-and-hold section 12 is replaced by a sample-and-hold section 35. The sample-and-hold section 35 is obtained by removing the switches S3a, S3b and the capacitor C3 from the sample-and-hold section 12.

FIGS. 7A to 7G are timing diagrams illustrating the operations of a CMOS image sensor according to the comparison example and are to be compared against FIGS. 5A to 5H. This CMOS image sensor selects a plurality of rows for a predetermined period of time (one cycle period) in synchronism with a clock signal. FIGS. 7A to 7G indicate that three rows are selected in cycles 1 to 3. Within each cycle period, the switches S1a, S1b remain in a conducting state for a predetermined period of time so that a dark signal of the pixel circuits P in each row is sampled, held, and subjected to A/D conversion.

Further, the switch S2a is in a conducting state during the time interval between the end of a dark signal sampling period of the pixel circuits P (the period during which the switch S1a is in a conducting state) and the end of a dark signal holding period (the period during which the switch S1b is in a conducting state) in order to sample the bright signal of the pixel circuits P.

Furthermore, the switch S2b is in a conducting state during the time interval between the end of a dark signal holding period of the pixel circuits P (the period during which the switch S1*b* is in a conducting state) and the end of a dark signal sampling period (the period during which the switch S1*a* is in a conducting state) in order to hold the bright signal of the pixel circuits P and subject it to A/D conversion.

More specifically, the row scanning circuit 4 selects a certain odd-numbered row in cycle 1 (between time t0 and time t1) to read a dark signal and a bright signal from each pixel circuit P in the selected row. In other words, in each pixel circuit P in the selected row, the selection signal SEL and the reset signals RE1, RE2, which are shown in FIG. 6, rise to H level to place the switch S1*a* in a conducting state. When the selection signal SEL is at H level, the transistor 25 conducts to couple the node N20 to the column amplifier 11 through the signal line SL.

When the reset signal RE1 rises to H level, the transistor 22 of the pixel circuit P shown in FIG. 6 conducts to reset the gate of the transistor 20 to the power supply voltage VDD, thereby outputting a dark signal to the node N20. When the reset signal RE2 rises to H level, the switch 33 of the column amplifier 11 conducts to reset the output voltage of the column amplifier 11 to the common mode voltage.

Next, the reset signal RE1 falls to L level to place the transistor 22 in a non-conducting state. The reset signal RE2 then falls to L level to place the switch 33 in a non-conducting state, thereby activating the column amplifier 11. Hence, the dark signal appearing at the node N20 is amplified by the column amplifier 11 and given to the capacitor C1 through the switch S1*a*. The capacitor C1 is charged with the voltage of the dark signal.

Subsequently, when the switch S1*a* goes into a non-conducting state, the read signal TX rises to H level with the switch S2*a* placed in a conducting state. When the read signal TX is at H level, the transistor 23 goes into a conducting state so that a current having a level corresponding to the incident light intensity flows to the photodiode 24. This decreases the gate voltage of the transistor 20, thereby decreasing the voltage of the node N20. In this instance, the signal appearing at the node N20 is a bright signal. The bright signal is amplified by the column amplifier 11 and given to the capacitor C2 through the switch S2*a*. The capacitor C2 is charged with the voltage of the bright signal.

Next, the switch S1*b* goes into a conducting state so that a reset signal RE3 rises to H level to put a dark signal A/D conversion process on standby. When the switch S1*b* goes into a conducting state, the inter-terminal voltage of the capacitor C1 is given to the node N31, buffered by the operational amplifier 34, and given to the comparator 13. When the reset signal RE3 falls to L level, the dark signal A/D conversion process starts. The dark signal A/D conversion process ends in a short time.

When the dark signal A/D conversion process ends, the switches S1*b*, S2*a* go into a non-conducting state. When the switches S1*b*, S2*a* are placed in a non-conducting state, the node N31 of the sample-and-hold section 12 goes into a floating state.

Next, the switch S2*b* goes into a conducting state so that the inter-terminal voltage of the capacitor C2 is given to the node N31, buffered by the operational amplifier 34, and given to the comparator 13. This starts a bright signal A/D conversion process. The bright signal A/D conversion process takes time according to the incident light intensity and is performed in cycles 1 and 2.

In cycle 2 (between time t1 and time t2), the row scanning circuit 4 selects the next even-numbered row to read the dark and bright signals from each pixel circuit P in the selected row. In other words, in each pixel circuit P in the selected row, the selection signal SEL and the reset signals RE1, RE2, which are shown in FIG. 6, rise to H level to place the switch S1*a* in a conducting state. When the selection signal SEL is at H level, the transistor 25 conducts to couple the node N20 to the column amplifier 11 through the signal line SL.

When the reset signal RE1 rises to H level, the transistor 22 of the pixel circuit P shown in FIG. 3 conducts to reset the gate of the transistor 20 to the power supply voltage VDD, thereby outputting a dark signal to the node N20. When the reset signal RE2 rises to H level, the switch 33 of the column amplifier 11 conducts to reset the output voltage of the column amplifier 11 to the common mode voltage.

Next, the reset signal RE1 falls to L level to place the transistor 22 in a non-conducting state. The reset signal RE2 then falls to L level to place the switch 33 in a non-conducting state, thereby activating the column amplifier 11. Hence, the dark signal appearing at the node N20 is amplified by the column amplifier 11 and given to the capacitor C1 through the switch S1*a*. The capacitor C1 is charged with the voltage of the dark signal.

Subsequently, the switch S1*a* goes into a non-conducting state to terminate a dark signal sampling process, and the switch S2*b* goes into a non-conducting state to terminate a bright signal holding process and the bright signal A/D conversion process. Next, the read signal TX rises to H level with the switch S2*a* placed in a conducting state. When the read signal TX is at H level, the transistor 23 goes into a conducting state so that a current having a level corresponding to the incident light intensity flows to the photodiode 24. This decreases the gate voltage of the transistor 20, thereby decreasing the voltage of the node N20. In this instance, the signal appearing at the node N20 is a bright signal. The bright signal is amplified by the column amplifier 11 and given to the capacitor C2 through the switch S2*a*. The capacitor C2 is charged with the voltage of the bright signal.

Next, the switch S1*b* goes into a conducting state so that the reset signal RE3 rises to H level to put a dark signal A/D conversion process on standby. When the switch S1*b* goes into a conducting state, the inter-terminal voltage of the capacitor C1 is given to the node N31, buffered by the operational amplifier 34, and given to the comparator 13. When the reset signal RE3 falls to L level, the dark signal A/D conversion process starts. The dark signal A/D conversion process ends in a short time.

When the dark signal A/D conversion process ends, the switches S1*b*, S2*a* go into a non-conducting state. When the switches S1*b*, S2*a* are placed in a non-conducting state, the node N31 of the sample-and-hold section 12 goes into a floating state.

Next, the switch S2*b* goes into a conducting state so that the inter-terminal voltage of the capacitor C2 is given to the node N31, buffered by the operational amplifier 34, and given to the comparator 13. This starts a bright signal A/D conversion process. The bright signal A/D conversion process takes time according to the incident light intensity and is performed in cycles 2 and 3. The subsequent operations are the same as described earlier.

In the comparison example, which has been described above, as is obvious, for instance, from cycle 2 operations shown in FIGS. 7A to 7G, the dark signal of pixel circuits P in row N is sampled while the bright signal of pixel circuits P in row (N−1) is held and subjected to A/D conversion, and the dark signal of pixel circuits P in row N is held and subjected to A/D conversion while the bright signal of pixel circuits P in row N is sampled. It should be noted, however, that N is an integer of 2 or greater.

In the first embodiment, on the other hand, as is obvious, for instance, from cycle 2 operations shown in FIGS. 5A to 5H, the dark signal of pixel circuits P in row N is sampled and in addition the bright signal of pixel circuits P in row N is sampled while the bright signal of pixel circuits P in row (N−1) is sampled and subjected to A/D conversion. Further, the dark signal of pixel circuits P in row N is held and subjected to A/D conversion while the bright signal of pixel circuits P in row N is sampled. Consequently, the first embodiment makes it possible to perform A/D conversion at a higher speed than the comparison example.

Second Embodiment

Figure 8:
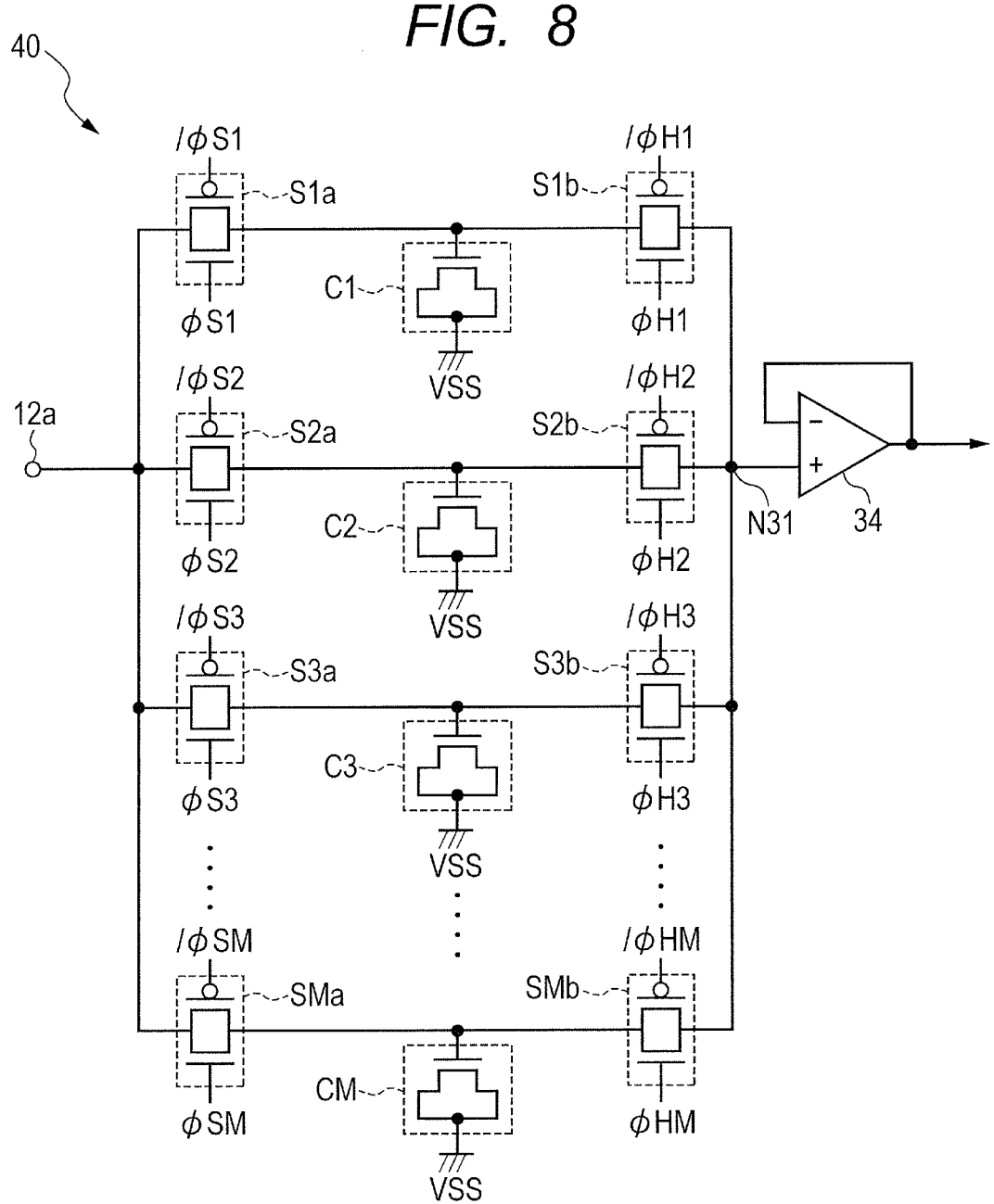
FIG. 8 is a circuit diagram illustrating the configuration of a sample-and-hold section included in the CMOS image sensor according to a second embodiment of the present invention.

FIG. 8 is a circuit diagram illustrating the configuration of a sample-and-hold section 40 included in the CMOS image sensor according to a second embodiment of the present invention and is to be compared against FIG. 4. The sample-and-hold section 40 shown in FIG. 8 differs from the sample-and-hold section 12 shown in FIG. 4 in that the former includes M sets of sample-and-hold circuits (M is an integer of 4 or greater).

More specifically, the sample-and-hold section 40 includes an input terminal 12a, switches S1a to SMa, S1b to SMb, capacitors C1 to CM, and an operational amplifier 35. One terminal of each switch S1a to SMa is coupled to the input terminal 12a. The other terminal of each switch S1a to SMa is coupled to one terminal of each switch S1b to SMb. The other terminal of each switch S1b to SMb is coupled to a non-inverting input terminal of the operational amplifier 35.

The switches S1a to SMa, S1b to SMb are each formed by a transfer gate that includes a P-channel MOS transistor and an N-channel MOS transistor, which are parallel-coupled. The gates of the P-channel MOS transistors included in the switches S1a to SMa, S1b to SMb respectively receive control signals /φS1 to /φSM, /φH1 to /φHM. The gates of the N-channel MOS transistors included in the switches S1a to SMa, S1b to SMb respectively receive control signals φS1 to φSM, φH1 to φHM. The control signals /φS1 to /φSM, /φH1 to /φHM are the inversions of the control signals φS1 to φSM, φH1 to φHM, respectively.

When the control signals φS1 to φSM, φH1 to φHM are at H level, the switches S1a to SMa, S1b to SMb go into a conducting state. When the control signals φS1 to φSM, φH1 to φHM are at L level, the switches S1a to SMa, S1b to SMb go into a non-conducting state.

The capacitors C1 to CM each include an N-channel MOS transistor. The source and drain of the N-channel MOS transistor included in the capacitors C1 to CM both receive the ground voltage VSS, and the gate is coupled to the other terminals of the switches S1a to SMa.

The output terminal of the operational amplifier 34 is coupled to its inverting input terminal. The operational amplifier 34 outputs a voltage having the same level as a voltage of its non-inverting input terminal (node N31) as the output voltage of the sample-and-hold section 40.

The first sample-and-hold circuit formed by the switches S1a, S1b and the capacitor C1 is used to sample and hold a dark signal during each cycle period. An mth sample-hand-hold circuit formed by switches Sma, Smb and a capacitor Cm is used to sample and hold a bright signal. It should be noted, however, that m is an integer of 2 or greater but not greater than M. Second to Mth sample-and-hold circuits are sequentially selected for one cycle period and used to sample and hold a bright signal during a selected cycle period.

When, for instance, a dark signal and a bright signal of pixel circuits P in the first to (M−1)th rows are to be read, the dark signal of the pixel circuits P in the first to (M−1)th rows is sampled and held by the first sample-and-hold circuit, and the bright signal of the pixel circuits P in the first to (M−1)th rows is sampled and held by the second to Mth sample-and-hold circuits.

In other words, the dark and bright signals of the pixel circuits in the first row are respectively sampled and held by the first and second sample-and-hold circuits, the dark and bright signals of the pixel circuits in the second row are respectively sampled and held by the first and third sample-and-hold circuits, and the dark and bright signals of the pixel circuits in the (M−1)th row are respectively sampled and held by the first and Mth sample-and-hold circuits.

The second embodiment, which has been described above, provides the same advantages as the first embodiment.

Third Embodiment

Figure 9:
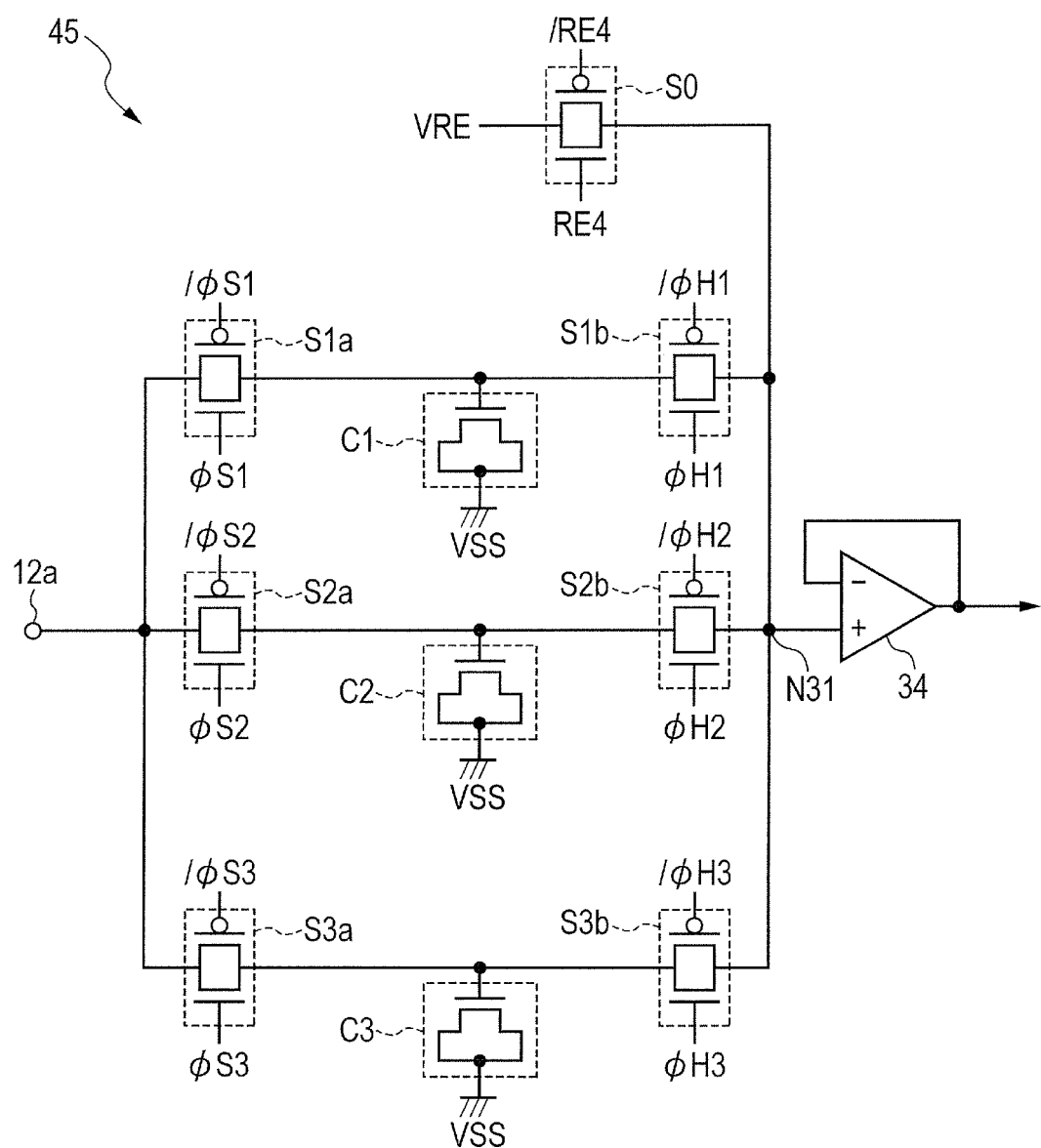
FIG. 9 is a circuit diagram illustrating the configuration of a sample-and-hold section included in the CMOS image sensor according to a third embodiment of the present invention.

FIG. 9 is a circuit diagram illustrating the configuration of a sample-and-hold section 45 included in the CMOS image sensor according to a third embodiment of the present invention and is to be compared against FIG. 4. The sample-and-hold section 45 shown in FIG. 9 differs from the sample-and-hold section 12 shown in FIG. 4 in that a switch S0 is added to the former.

One terminal of the switch S0 receives a reset voltage VRE, and the other terminal is coupled to the node N31. The reset voltage VRE is set to be close to the voltage of the dark signal, for example, the common mode voltage of the column amplifier 11 coupled to the input of the sample-and-hold section 45.

The switch S0 is formed by a transfer gate that includes a P-channel MOS transistor and an N-channel MOS transistor, which are parallel-coupled. The gates of the N-channel MOS transistor and P-channel MOS transistor included in the switch S0 respectively receive a reset signal RE4 and its inversion /RE4.

The reset signal RE4 is at H level during a period during which all the holding switches S1b to S3b are in a non-conducting state and at L level during the other period. When the reset signal RE4 rises to H level, the switch S0 conducts to reset the node N31 to the reset voltage VRE. When the reset signal RE4 falls to L level, the switch S0 goes into a non-conducting state.

In the third embodiment, the node N31 is reset to the reset voltage VRE while all the holding switches S1b to S3b are in a non-conducting state. This makes it possible to prevent an erroneous A/D conversion result from being produced by the parasitic capacitance of the node N31.

While the embodiments of the present invention contemplated by the inventors have been described in detail, the present invention is not limited to the specific embodiments described above. It is to be understood that many variations and modifications of the present invention may be made without departing from the spirit and scope of the present invention.

What is claimed is:

1. A solid-state image sensing device comprising:
   a plurality of pixel circuits arrayed in a plurality of rows and columns;
   a row scanning circuit that sequentially selects the rows one by one for one cycle period and causes each pixel circuit in a selected row to output a dark signal and a bright signal; and an A/D converter that is disposed for each column to convert each of the dark and bright signals, which are output from the pixel circuits in the associated columns, to a digital signal;

wherein the A/D converter includes a first sample-and-hold circuit that samples and holds a dark signal output from the pixel circuits in the associated column for each cycle period, and second to Mth sample-and-hold circuits (M is an integer of 3 or greater) that are sequentially selected one by one for one cycle period to sample and hold a bright signal output from the pixel circuits in the associated column for a selected cycle period, and wherein the A/D converter converts each of the signals held by the first to Mth sample-and-hold circuits to a digital signal.

2. The solid-state image sensing device according to claim 1, wherein the first to Mth sample-and-hold circuits each include a first switch that receives at one terminal the dark and bright signals output from the pixel circuits in the associated column and conducts during a sampling period, a capacitor that is coupled between the other terminal of the first switch and a reference voltage line, and a second switch that is coupled at one terminal to the other terminal of the first switch, is coupled at the other terminal to a predetermined node, and conducts during a holding period.

3. The solid-state image sensing device according to claim 2, wherein the A/D converter includes a third switch that receives at one terminal a reset voltage, is coupled at the other terminal to the predetermined node, and conducts when the second switches of the first to Mth sample-and-hold circuits go into a non-conducting state.

4. A A/D converter comprising:

a first sample-and-hold circuit that samples and holds a dark signal output from pixel circuits for each cycle period, and second to Mth sample-and-hold circuits (M is an integer of 3 or greater) that are sequentially selected one by one for one cycle period to sample and hold a bright signal output from the pixel circuits for a selected cycle period, and wherein the A/D converter converts each of the signals held by the first to Mth sample-and-hold circuits to a digital signal.

* * * * *